United States Patent [19]

Köppl et al.

[11] 4,179,530
[45] Dec. 18, 1979

[54] PROCESS FOR THE DEPOSITION OF PURE SEMICONDUCTOR MATERIAL

[75] Inventors: Franz Köppl, Altötting; Helmut Hamster, Burghausen; Rudolf Griesshammer, Burghausen; Helmut Lorenz, Burghausen, all of Fed. Rep. of Germany

[73] Assignee: Wacker-Chemitronic Gesellschaft fur Elektronik-Grundstoffe mbH, Burghausen, Fed. Rep. of Germany

[21] Appl. No.: 3,060

[22] Filed: Jan. 12, 1979

Related U.S. Application Data

[62] Division of Ser. No. 878,127, Feb. 14, 1978.

[30] Foreign Application Priority Data

May 20, 1977 [DE] Fed. Rep. of Germany ....... 2722778

[51] Int. Cl.² ................................................ B05D 5/12
[52] U.S. Cl. ......................................... 427/51; 427/86; 427/314
[58] Field of Search .................................. 427/50–52, 427/69, 70, 78, 86, 87, 91, 109, 166, 167, 248, 250–253, 314; 118/48–49.5; 48/174, 175

[56] References Cited

U.S. PATENT DOCUMENTS

| | | | |
|---|---|---|---|
| 3,152,933 | 10/1964 | Reuschel | 427/50 X |
| 3,240,623 | 3/1966 | Heim | 427/51 |
| 3,330,251 | 7/1967 | Gutsche | 118/49.5 |
| 3,524,426 | 8/1970 | Ogle, Jr. | 118/49 |
| 3,717,439 | 2/1973 | Sakai | 148/175 X |
| 3,748,169 | 7/1973 | Keller | 427/87 X |
| 3,804,059 | 4/1974 | Streel | 118/49 |
| 3,895,602 | 7/1975 | Bobenrieth | 118/49.1 |
| 3,918,396 | 11/1975 | Dietze et al. | 118/49.1 |
| 3,962,670 | 6/1976 | Dietze | 118/49 X |
| 4,000,335 | 12/1976 | Stahl | 427/74 |

*Primary Examiner*—Morris Kaplan
*Attorney, Agent, or Firm*—Allison C. Collard; Thomas M. Galgano

[57] ABSTRACT

In a device and process for the deposition of pure semiconductor materials, especially silicon, by thermal decomposition of gaseous compounds of said semiconductor materials on carrier bodies heated to decomposition temperatures, wherein the device consists of a metallic base plate, mounting means and electrical connections thereon for heating the carrier bodies, as well as pipe connections for supply and exhaust of said gaseous compounds, and a bell-shaped cover slipped onto the base plate and forming a gas-tight seal therewith, the improvement that the area of the bell-shaped cover facing the reaction space consists of silver or silver-plated steel. A removable heating element is used to preheat the carrier bodies and a cylinder disposed about the bell forms therewith a closed annular cooling chamber.

4 Claims, 2 Drawing Figures

U.S. Patent  Dec. 18, 1979  4,179,530
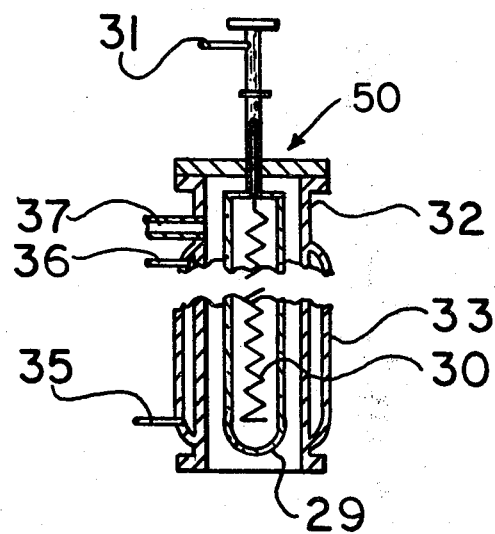
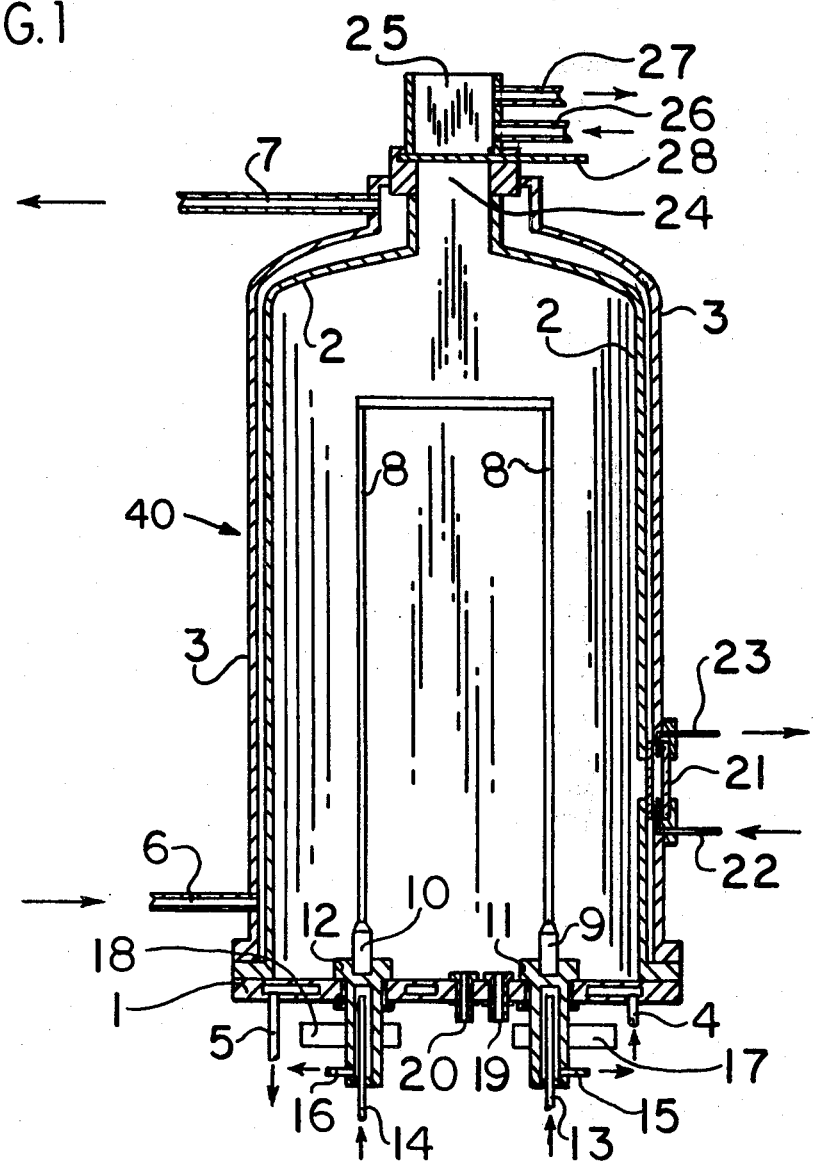

PROCESS FOR THE DEPOSITION OF PURE SEMICONDUCTOR MATERIAL

This is a division of application Ser. No. 878,127, filed Feb. 14, 1978.

The invention relates to a process for the deposition of pure semiconductor material on carrier bodies by thermal decomposition of gaseous compounds of the semiconductor material on carrier bodies heated to decomposition temperature. A device to carry out the method of the invention comprises a metallic base plate with means for mounting the carrier bodies thereon and electrical contacts for the passage of current through the bodies for heating them to decomposition temperature of the gaseous compounds, as well as pipe connections for the supply and exhaust of the gaseous compounds, and it has a bell-shaped cover slipped over the base plate to which it is attached in a gas-tight manner.

This type of device and method for making semiconductor material are well known, e.g., when a silicon compound in its gaseous state is thermally decomposed and forms free silicon, which is deposited from the gas phase on a heated carrier body. Heretofore, tubes of quartz or copper were used as reaction vessels where a wire or a rod of the same semiconductor material was clamped in, serving as a carrier body (see German Pat. No. 12 05 505). For larger amounts of gases and their decomposition, as well as for the deposition of the released semiconductor material upon several carrier bodies, reaction vessels were preferred like those already described in the German Pat. No. 12 64 400. These substantially consist of a metallic base plate made of, for example, silver or silverplate steel furnished with plugs for the carrier bodies and with the necessary gas conduits, and a quartz bell slipped over the base plate. For this type of reactor, the quartz bell is pressed onto the base plate by a compressed gas which acts from outside, and the combination is furnished with appropriate packings. This system of sealing which needs a second metallic pressure hood on top of the first one is very cumbersome and often leads to production difficulties.

It is a further drawback of quartz bells of that kind that it is difficult to cool them uniformly. Thus, during the deposition of so called high-boilers, namely, polymeric products consisting of silicon, chlorine and hydrogen, resulting from the decomposition of the reaction gases which are deposited as a coating upon the quartz walls (see German Offenlegungsschrift No. 21 52 313), it is difficult to optically control the thickness of the growing polycrystalline silicon rods. It is also difficult to control the temperature when using optical pyrometers. Therefore, a periodic disassembling of the quartz bells becomes necessary in order to cleam them. It is also necessary to clean the bells because in such devices, the thin silicon rods serving as carrier bodies are heated, at the beginning of the deposition process, from the outside of the quartz bell by radiant heat, in order to reach the ignition temperature. Ignition temperature means the temperature at which the thin silicon rods become sufficiently conductive in order to be heated to the needed deposition temperature. Deposition processes, which have a large portion of silicon compounds in the deposition gas cause an increased development of high-boilers, and cannot be carried out in quartz devices due to the wall deposits of these high-boilers, an effect which is very difficult to prevent.

An additional decisive disadvantage of such quartz equipment is also the great sensitivity of quartz to shock and pressure. That is also the reason why such quartz bells are practically never built at heights above 150 cm and diameters greater than 80 cm. Furthermore, it is practically impossible to perform depositions at increased pressures, because in such cases, an approximately equal pressure would have to be exerted upon the outer wall of such quartz bells in order to prevent the bell from breaking. The German Offenlegungsschriften No. 23 24 365, 23 59 563 and 23 63 254, for example, describe expensive reaction vessels furnished with jackets for compressed gas and alarm systems when the pressure changes within the reaction space, thus protecting the quartz bell against breaking or leaking. It is an object of the invention to provide a reaction vessel which does not show the above mentioned disadvantages of the prior art devices.

It is an additional object of the invention to provide a process to be carried out in the device under comparatively high pressure without risking the breakdown of the device. Other objects and advantages will become apparent from the detailed description below.

The objects according to the invention are accomplished by providing a device of the type described with a base plate, the equipment mentioned being used for mounting and heating the carrier bodies to deposition temperature for the pure semiconductor material, the bell-shaped cover forming a gas-tight seal therewith, the improvement residing in that the entire surface of the bell facing the decomposition chamber consists of silver or of silverplated steel. Silverplating of the inner face of the steel bell is preferably accomplished according to a process as, for example described in the German Pat. Nos. 95 63 69 and 10 33 378. According to these processes, silverplating is carried out by applying molten silver or a suitable silver alloy, respectively, to a steel base in the presence of atomic hydrogen, and by smoothing down this layer after its solidification by planing, milling or other mechanical operations. Here it is particularly recommended to reinforce the base layer, applied to the steel support in the presence of atomic hydrogen, preferably with molten silver, until the desired gauge of plating is obtained. This silver hood or silverplated hood is preferably surrounded on its outside by a cooling system, consisting, for example, of cooling tubes surrounding the hood or a cooling coil concentrically surrounding the hood. In a preferred embodiment, a second hood consists of metal, particularly high-grade steel, which surrounds concentrically the inner hood. The second hood is slipped over the inner hood at a close spacing, in which case the cooling medium streams through the gas between both hoods. Guide-ribs which lead upwards from the bottom within the cavity formed by the outer and inner hoods force the cooling medium to follow a defined path. This construction allows, for example, air cooling at high flow rates, because there is no danger of breaking the inner hood. Preferably a liquid, such as water, is pumped through, allowing the inner hood to be kept at almost any desired temperature due to the insensitivity to pressure of the system. In the case of a silverplated steel bell, the upper limit of temperature is only determined by the evaporation temperature of silver which lies near 800° C. The lower temperature limit is definitely determined by the room temperature because lower temperature would need the use of refrigerators and would also offer no advantage for the deposition of a semiconductor material. Temperatures from about 70° to 200° C. of the inner hood have proven to be the most advantageous range for depositing in this bell.

Due to the fact that the bell according to the invention is not permeable to heat radiation, heating of the silicon carrier bodies used for the deposition (the ignition temperature being at about 600° C.) is accomplished by the introduction of a heating finger into the reaction space through the apex of the bell. Substantially, the heating finger consists, for example, of an elongated quartz cylinder, fused at its bottom, within which a heating coil is disposed. It is advisable to introduce an inert gas, such as argon, in the finger. The quartz cylinder is provided on its top with electrical contacts and gas inlets and outlets. This quartz cylinder is disposed within a second steel cylinder which is provided on the coverplate with mountings and a device for lifting and lowering the quartz cylinder, and also with inlets and outlets for a protective gas, such as argon. The steel cylinder is also furnished with adequate connections for the introduction and discharge of a cooling medium that streams through the cooling jacket of this cylinder. By using appropriate gaskets, this silver or silverplated cylinder is screwed to the bell, fitting well into the recess disposed at the apex of the bell, so that the quartz cylinder may be lowered into the reaction space. After the ignition of the silicon rods, the heating finger is retracted from the bell into the protective cylinder and the recess of the bell apex is closed with a cover. The bell is fastened to the silver or silverplated base plate simply by flanges, using interposed gaskets, preferably polytetrafluoroethylene gaskets.

The device for deposition, allows in principle all kinds of depositions caused by the decomposition of a gaseous compound, using appropriate carrier bodies. Shaped bodies consisting of silicon may be produced by the deposition from the gas phase upon carrier bodies made out of graphite or graphite film. In that case, the introduction of a heating finger at the start of the deposition is superfluous, because graphite is already conductive at room temperature, thus allowing it to become heated by the direct passage of a current to the appropriate decomposition temperature of the gaseous compound of silicon which is used in any particular case.

By the same method, polycrystalline silicon rods may be produced by the deposition from the gas phase upon carrier bodies consisting of silicon and heated to the decomposition temperature of the gas. The device for the deposition of semiconductors is best suited for a new method of precipitation of pure semiconductor material, particularly silicon, by thermal decomposition of gaseous compounds of these semiconductor materials, onto carrier bodies which are heated by the passage of an electrical current to the decomposition temperature of the respective gaseous compound, when an excess pressure of 1 to 16 bar is in the reaction space.

Heretofore, such depositions at excess pressure could not be performed in large plants, due to the sensitivity to breakage of the brittle quartz bells. In principle, the depositions could be performed at even higher pressure, but such conditions do not lead to any considerable increase of deposited mass per unit of time. (see Note:) Excess pressures in the range of 4 to 8 bar were found particularly advantageous. In principle, silane, dichlorosilane or trichlorosilane may be used as deposition gases, usually in mixtures with hydrogen in which case a mixture of gases, consisting of 30 to 60 percent by volume trichlorosilane and 40 to 70 percent by volume hydrogen is preferably used as a deposition gas. An increase of the amount of trichlorosilane within the mentioned range may be advantageous during the deposition. The thin silicon rods which serve as carrier bodies are heated to their ignition temperature within the reaction vessel in an inert gas, such as argon, by introducing the heating finger prior to the introduction of the deposition gas. The heating finger is removed from the reaction vessel after the ignition of the rods. The thin silicon rods are subsequently heated up to the decomposition temperature by the direct passage of a current, and the deposition gas is introduced into the reaction vessel while the inner wall of the hood is simultaneously cooled. The growth of the rods is controlled for example by optical measurement of thickness by means of a sight glass made of quartz which is built into the wall of the reaction vessel. The temperature of the sight glass itself may be regulated by a separate cooling circuit so that the deposition of silicon at too high a temperature can be prevented or the condensation of trichlorosilane at too low a temperature may also be prevented.

Note: An excess pressure of 16 bar corresponds to the pressure range according to DIN 2401, so that for pressures above this value, the plant would have to be built for an excess pressure of the next pressure range—at least within the area of the Federated Republic of Germany. The expenses incurred thereby do not correspond to any reasonable increased rate of deposition.

The advantage of the new deposition method lies in a considerably higher yield rate of deposited semiconductor material compared to heretofore used devices and methods and also in an increased yield of silicon in the deposited product calculated on silicon content of the deposition gas. Considerably less energy is needed for this process in comparison to all other known processes due to the high yield rate for the space involved. Another advantage lies in the considerably longer life expectancy of the bell according to the invention, compared to quartz bells, and also in the lower costs of upkeep since the deleterious high-boiler ingredients do not precipitate on the inner face of the bell because of the precisely controlled temperature of the wall. Moreover, the construction of the bell as a pressure container increases also the safety of the service personnel.

The invention will now be more fully described with reference to the accompanying drawing of an embodiment of the deposition device, wherein;

FIG. 1 is a cross-sectional view of the device according to the invention; and

FIG. 2 illustrates, on a reduced scale and partly in section, a finger-shaped member for heating the thin silicon rods used as deposition bodies.

Referring to FIGS. 1 and 2, there is shown the deposition device 40, comprising a silverplated base plate 1 and a bell consisting of an inner hood 2, plated on the inside with silver, and an outer hood 3 of steel, slipped over hood 2. Base plate 1, to which the bell is fastened by a gastight flange connection, is provided with hollow spaces extending throughout its entire body. These spaces are connected by a short inlet pipe 4 and a short outlet pipe 5 to a cooling water circuit (not shown). The space which is enclosed by inner hood 2 and outer hood 3 is cooled during the deposition by pumping cooling water through it, entering at the pipe 6 and leaving through the pipe 7. Thin rods 8 which are, for example, disposed in a U-shape and which serve as deposition carriers, are held at their free ends by electrodes 9 and 10. In order to prevent a deposition upon the electrodes themselves, hollow electrode holders 11 and 12 are also cooled. The cooling water enters into the aforementioned hollow spaces through inlet pipes 13 and 14 and leaves through outlet pipes 15 and 16. The contacts 17 and 18 serve to connect conductively the electrodes with the electric circuit (not shown) The introduction and the removal of the gas during the deposition occurs through gas connections 19 and 20 which are placed at the underside of the base plate 1. A quartz window 21 serves to observe the process of the deposition. It consists basically of 2 quartz plates between which cooling water is pumped through inlets and outlets 22 and 23, respectively, in order to prevent a deposition of silicon due to thermal decomposition on the plate facing inwardly. At the apex of the bell there is an aperture 24, which can be closed with a cooling pot 25, fastened by a gas-tight flange connection. This cooling pot 25 is open at its top and may be fed through an inlet pipe 26 with a cooling agent, such as water, which runs off again through an overflow pipe 27.

Referring now to FIG. 2, a finger shaped heating member 50 is illustrated, which is introduced into the bell through aperture 24. At first, cooling pot 25 and a bushing 28, which serves as a packing, are removed from the bell aperture 24. The heating finger consists of an elongated quartz cylinder 29 with an electrical heating coil 30 and may, after prior evacuation, be filled through a glass connecting pipe 31 with an inert gas, for example argon, in order to prevent oxidation of the red hot heating coil. Quartz cylinder 29 is disposed within a second cylinder 32, consisting of steel, which may be connected in tight fit by a flange to bell aperture 24. Second cylinder 32 is surrounded on its outside by a cooling jacket 33, which may be fed with cooling water by an inlet 35. The water leaves through an outlet 36. At the upper end of this metal cylinder 32 there is also a gas outlet connection 37 through which air may escape from the reaction vessel when it is expelled by an inert gas such as argon for example, which is blown-in through gas openings 19 or 20 which, as already mentioned, are provided in base plate 1. Prior to the deposition, the quartz cylinder 29 is lowered into the reaction vessel to slightly above base plate 1. This is done after steel cylinder 32 has been connected to aperture 24 of the bell by a flange. The length of the quartz cylinder 29 corresponds at least to the length of the thin rods, grouped in pairs of 2, 4 or 8 around the quartz cylinder. Eight undoped thin silicon rods having a specific resistance of approximately 5000Ω, a diameter of 0.7 cm, and a length of 200 cm were connected in an U-shape by bridges out of the same material in pairs and fastened to water cooled electrodes inside a deposition device according to the invention heretofore described, having a height of 260 cm, a diameter of 120 cm and a distance of the inside silverplated inner hood from the slid-over outer steel hood, amounting to 2.5 cm. The four pairs of thin rods were grouped symmetrically around the longitudinal axis of the reaction vessel. Subsequently, cylinder 29 surrounding the heating finger was connected to the reaction vessel, air was expelled from the vessel by the introduction of argon and the heating finger was lowered into the interior closely over the base plate of the reaction vessel. Within approximately one hour the rods were heated to red heat, thus approximately to 600° C. About half an hour prior to the end of the heating period, an electrical potential was applied to the thin rods. Once the ignition temperature of the rods was reached, the heating finger was removed from the bell and aperture 24 was closed by fastening the cooling pot 25 by a flange arrangement. While the thin rods heated up to the needed deposition temperature of about 1050° C. by the current, a deposition gas was introduced in the reaction vessel. The gas consisted of equal volumes of hydrogen and trichlorosilane at an excess of 5 bar. The water cooling of the base plate of the bell and of the electrode clamps was already actuated during the heating process at which time the steel cylinder of the heating finger attached to the bell was passed by cooling water. After the removal of the heating finger, the apex of the bell also was cooled by the water cooling of the attached cooling pot. The deposition was interrupted after 220 hours. The average amount of passed gas during this time amounted to 220 kg per hour, calculated on trichlorosilane. The sum total of the deposited silicon amounted to 1200 kg and the final thickness of the rods was 20 cm. Removal of pure silicon from the rods is effected by conventional operations.

While only a single embodiment of the present invention was shown and described, it will be obvious to those persons of ordinary skill in the art that many changes and modifications may be made thereunto without departing from the spirit and scope of the invention.

What is claimed is:

1. A process for the deposition of pure semiconductor material, particularly silicon, by thermal decomposition of gaseous compounds of the semiconductor material on thin rods serving as carrier bodies heated to the decomposition temperature of the compounds by the passage of an electrical current comprising: providing an open topped reaction chamber whose interior surfaces are either of silver or silver plated and mounting said electrially heatable carrier rods therein; providing a cover cylinder about the reaction chamber and forming therewith a closed annular chamber; attaching a heating element at said open top and preheating said carrier rods; sealing the open top and removing said heating element; passing a heating current through the carrier rods; passing a coolant through the annular chamber; feeding said gaseous compounds into the reaction chamber and maintaining an excess pressure of 1–16 bar therein.

2. The process according to claim 1, wherein an excess pressure of 4–8 bar is applied within the reaction space.

3. The process according to claim 1, wherein a trichlorosilane-hydrogen mixture is used as deposition gas.

4. The process according to claim 3, wherein the gas mixture consists of 30–60% by volume of trichlorosilane and 40–70% by volume of hydrogen.

* * * * *